United States Patent [19]

Kosak et al.

[11] Patent Number: 5,461,542
[45] Date of Patent: Oct. 24, 1995

[54] MULTI-BOARD ELECTRICAL CONTROL DEVICE

[75] Inventors: Wolfgang Kosak, Moeglingen; Willy Bentz, Sachsenheim; Waldemar Ernst, Vaihingen/Enz.; Dieter Karr, Tiefenbronn; Paul Hermanutz, Gomaringen, all of Germany

[73] Assignee: Robert Bosch GmbH, Stuttgart, Germany

[21] Appl. No.: 335,672

[22] Filed: Nov. 8, 1994

Related U.S. Application Data

[63] Continuation of Ser. No. 150,404, Nov. 10, 1993, abandoned.

[30] Foreign Application Priority Data

Dec. 18, 1992 [DE] Germany .......................... 42 42 944.7

[51] Int. Cl.[6] ................................................... H05K 7/20
[52] U.S. Cl. ...................... 361/710; 165/80.3; 165/185; 257/727; 361/715
[58] Field of Search ............... 165/80.3, 104.33, 165/185; 174/16.3; 257/718–719, 726–727; 361/689–690, 704, 707–719, 722, 728, 730, 736, 752, 785

[56] References Cited

U.S. PATENT DOCUMENTS

| | | | |
|---|---|---|---|
| 4,654,625 | 3/1987 | Bentz et al. ...................... | 338/164 |
| 4,707,726 | 11/1987 | Tinder ............................. | 361/710 |
| 4,723,196 | 2/1988 | Hofmeister et al. . | |
| 4,916,575 | 4/1990 | Van Asten ........................ | 361/715 |
| 4,923,179 | 5/1990 | Mikolajczak .................... | 361/710 |
| 5,060,112 | 10/1991 | Cocconi .......................... | 361/719 |
| 5,060,113 | 10/1991 | Jacobs ............................ | 361/785 |
| 5,148,350 | 9/1992 | Chan et al. ..................... | 361/818 |
| 5,225,965 | 7/1993 | Bailey et al. ................... | 257/727 |
| 5,272,593 | 12/1993 | Jakob et al. .................... | 361/707 |

FOREIGN PATENT DOCUMENTS

| | | |
|---|---|---|
| 0381082 | 8/1990 | European Pat. Off. . |
| 3437988A1 | 4/1986 | Germany . |
| 3728456A1 | 3/1989 | Germany . |
| 9015130 U | 4/1991 | Germany . |

*Primary Examiner*—Gregory D. Thompson
*Attorney, Agent, or Firm*—Frishauf, Holtz, Goodman, Langer & Chick

[57] ABSTRACT

The housing (10) of an electrical device, in particular a switching and control device for motor vehicles, includes an upper shell (11) and a lower shell (12), and PC boards (15, 25) are located in both shells (11, 12). The required power components (17) are distributed to both PC boards (15, 25). The lower shell (11) of the housing (10) has side walls (16) encompassing three sides. The upper shell (11) has, in addition to the outer rim (21) extending around three sides, a protrusion (22) protruding into the housing on two opposed sides, so that a space (23) is created between the rim (21) and the extension (22). In the assembled state, the side wall (16) protrudes into the space (23) in the other shell (12). The power components (17) rest on the inner wall of the side wall (16) or of the extensions (22), so that the lost heat can be dissipated in a simple way.

20 Claims, 2 Drawing Sheets

MULTI-BOARD ELECTRICAL CONTROL DEVICE

This application is a Continuation of application Ser. No. 08/150,404, filed Nov. 10, 1993, now abandoned. Cross-reference to related patents, assigned to the assignee of the present invention, the disclosures of which are hereby incorporated by reference: U.S. Pat. No. 4,654,625, BENTZ, ELECTRONIC CONTROL UNIT STRUCTURE; U.S. Ser. No. 07/884,595, BENTZ, ERNST, et al., filed May 15, 1992, now U.S. Pat. No. 5,277,614, issued Jan. 11, 1994.

FIELD OF THE INVENTION

The invention relates generally to an electrical control device and housing to retain multiple printed circuit (PC) boards.

BACKGROUND

In electric control devices used previously in the industry, in which two PC boards are disposed in the housing, all the power components are located on a base plate of the housing. The power components are affixed to cooling faces and then are soldered on. Since until now all the power elements have been located exclusively on the base plate, the number of these components has been limited. This construction also severely limits the magnitude of the dissipatable power loss of the power components.

THE INVENTION

It is an object to provide a housing for printed circuit (PC) boards to which power semiconductor devices are connected, which permits a larger number of power and other components to be retained in a housing than heretofore, while providing good heat dissipation of the power loss of the components.

Briefly, the electrical portion of the control device, typically two printed circuit (PC) boards, having signal processing as well as power components located thereon, form, together with the housing, a combination. The housing has two housing portions or shells which can be assembled together. Each housing portion has a top or end wall, and wall extensions which project from the respective top or end wall at an essentially right angle. The wall extensions are so located on the respective top or end wall that, when the housing portions are assembled together with the extensions facing each other, the extension from at least one housing portion will telescopically nest, with clearance space, within the other housing portions. This clearance space permits locating at least some of the power components of power component groups, associated with respective printed circuit boards, on the extensions. The printed circuit boards themselves are mounted on the respective housing portions, for example one printed circuit board, each, located parallel to the respective top walls of the housing portions.

In accordance with a feature of the invention, the extensions are located inwardly of one or more side walls projecting from the top wall portion. The two housing portions can be mirror symmetrical.

In accordance with another feature of the invention, at least one of the housing portions can be formed in two parts, in which a top wall or end wall part and an extension part are constructed as separate elements, secured together, for example by screws. The extension part can be made in form of a frame.

The electrical control device housing according to the invention has the advantage over the prior art that the number of power components that can be mounted is increased. At the same time, good, secure heat dissipation of the power loss of the power components is assured. Moreover, the other electrical components on the two PC boards can be distributed in such a way that it is possible to split the circuit into individual regions. This reduces the layout area required. Also, the electromotive performance of the electrical control device is improved. The individual distribution of the electrical components to two separate PC boards would also make it possible to provide two completely independent circuits in one control device. Since all the power components are connected to the environment directly via the various housing walls, the power loss of the power components can be dissipated directly. Rapid dissipation of the lost heat is possible as a result. Because of the individual disposition of the electrical components, the electrical connecting lines between the two PC boards can also be shortened.

DRAWING

Exemplary embodiments of the invention are shown in the drawing and described in detail below:

DETAILED DESCRIPTION OF THE EXEMPLARY EMBODIMENTS

Figure 1:
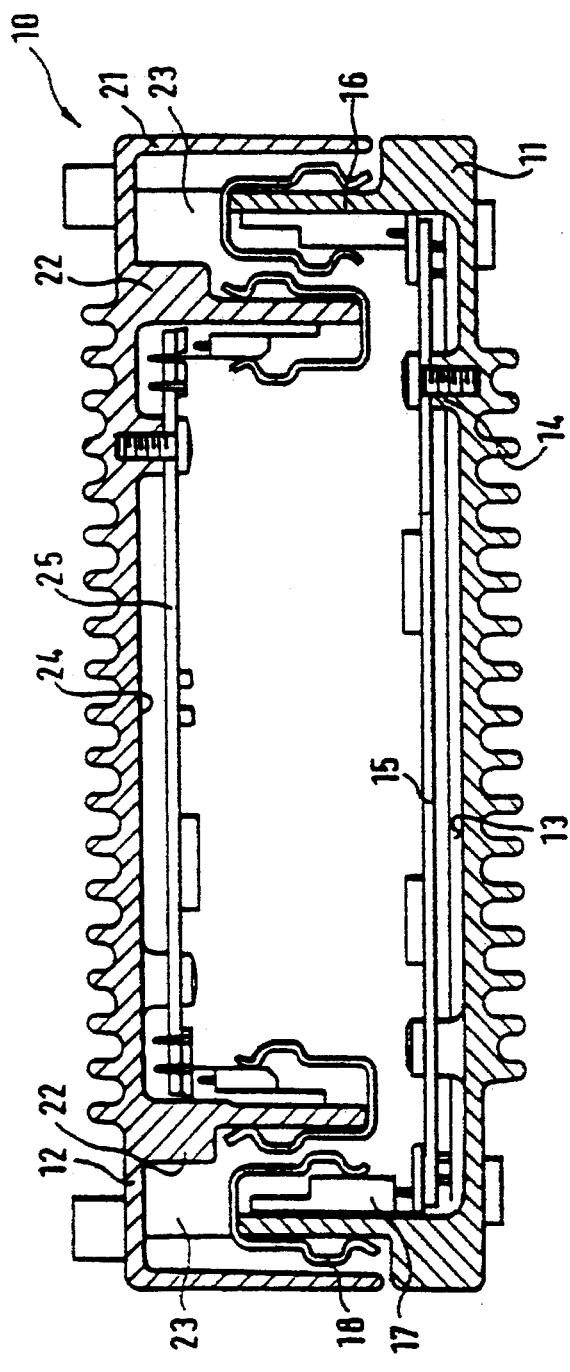
FIG. 1 is a longitudinal section through a control device.

In FIG. 1, reference numeral 10 indicates the housing of a control device, which comprises a lower housing portion, or shell 11 and an upper housing portion, or shell 12. A base plate 15 is located on the bottom 13 of the lower shell 11, resting on knobs 14, and projects as far as side walls 16 forming wall extensions of the lower shell 11, which encompass three sides and are inclined by approximately 90° with respect to the bottom 13. Electrical components are located on the base plate 15 in conventionally known manner, not shown in the drawing. Power components 17 are soldered, for example, to the outer edge of the base plate 15. To enable dissipating the high power losses of these power components 17, which are in the form of heat, the power components 17 rest with their back against the side wall 16 of the lower shell 11 and are pressed against this side wall by a retaining spring 18.

The upper shell 12 has an outer side wall or rim 21 forming a wall extension of shell 12, which like the side walls 16 extends around three sides and is inclined by approximately 90° from the bottom. In addition, an inner rim 22 forming another wall extension of shell 12 that projects into the interior of the housing is formed on two opposed sides. This defines a space 23 on two opposed sides between the outer rim 21 and the inner rim 22. In the assembled state of the housing 10, the side wall 16 with the power components 17 protrudes into the space 23 of the upper shell 12 formed between the inner and outer rims 22 and 21. On the bottom 24 of the upper shell 12, in the region between the inner rims 22, an additional plate 25 used as a second base plate is fastened, and electrical components and power components 17 are located on it, again in the conventionally known manner but not shown in the drawing. The power components 17 are shown in FIG. 1 and are soldered to the edge of the additional plate 25, so that they rest with their backs against the inner wall of the inner rim 22 and are fixed in position by a retaining spring 18. The contact of the power components 17 with the inner rim 22 is necessary, especially for the sake of heat dissipation. The bottom 13 of shell 11, and the facing wall of shell 12 form top or end walls of the respective shells.

The base plate 15 of the lower shell 11 and the additional plate 25 of the upper shell 12 are connected, suitably by soldering, to respective blade conductor (S) connector strips 28, 29 with the aid of sturdy contacts 27. The blade conductor (S) contact connections strip 28 for the additional plate 25 rests on the blade conductor (S) strip 29 for the base plate 15, and together they thus simultaneously form one side wall of the housing 10. Plug prongs 30 are located on the outside of the blade contact connector strips 28, 29, permitting, in the conventionally known way, connection of the control device to a cable harness.

In the interior of the housing 10, the additional plate 25 and the base plate 15 are electrically connected with the aid of a rigid plug connector 33. The plug connector 33 comprises an upper part 34 and a lower part 35, which are inserted into one another in the manner of a tongue and groove connection. The upper part 34 protrudes with an extension 36 into a recess 37 of the lower part 35, or vice versa, so that the electrical contacts 38 located in the upper part 34 and lower part 35 simultaneously touch. This enables separate manufacture of the base plate 15 and additional plate 25 and ensuing automatic assembly.

By the special configuration of the housing 10, in particular of the lower shell 11 and upper shell 12, the power components 17 can be located directly on the side walls 16 and on the inner rims 22 of the lower and upper shells 11 and 12, respectively, so that the side walls and the rims serve as cooling elements, and no separate parts are needed as heat sinks for the power components. In assembly, the power components 17 are not fixed to the side walls or the rims, acting as cooling faces, with the aid of the retaining springs 18 until after they have been soldered onto the additional plate 25 and base plate 15. However, if separate heat sinks were used, then the power components would be affixed to the cooling faces first and then soldered onto the base plate.

Figure 2:
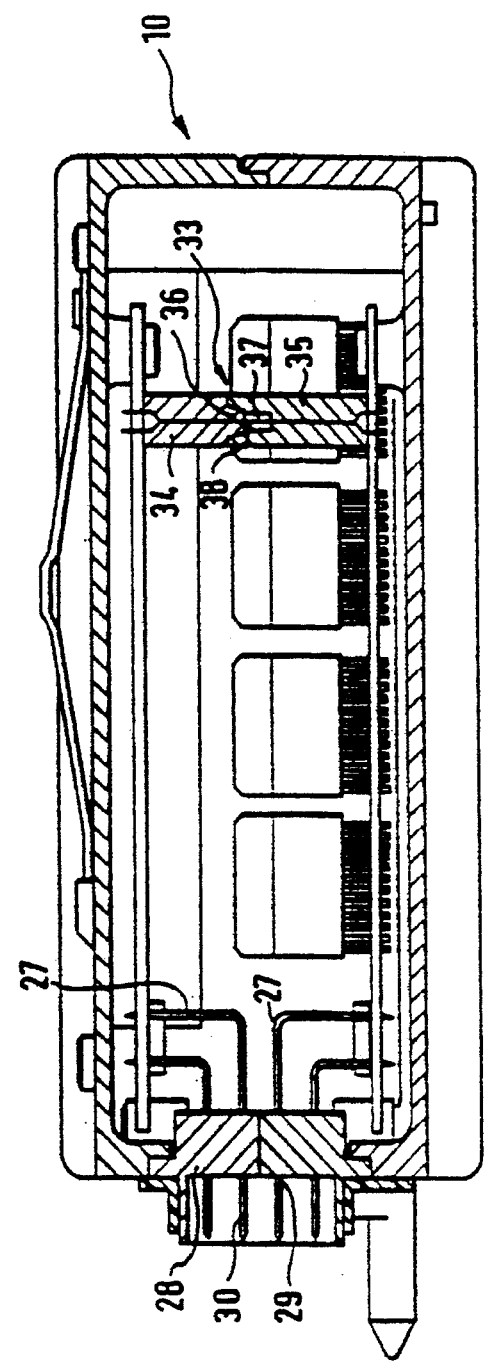
FIG. 2 is a corresponding side view.

In the exemplary embodiment of FIGS. 1 and 2, a specially formed lower shell 11 and a specially formed upper shell 12 are necessary. In the exemplary embodiment of FIG. 3, the upper shell 41 and lower shell 42 are identically shaped. To form the housing 43 of the control device, two shells 41, 42 are placed on one another in mirror-inverted fashion. The shells 41, 42 have an outer rim 44 extending around three sides. Moreover, an inner rim 45, 46 is provided on two opposed sides; one rim 45 is located as close as possible to the outer rim 44, while there is a space 47 between the other inner rim 46 and the outer rim 44. This space 47 is at least large enough that the inner rim 46, with the fixed power components 17 of the other shell and with the retaining springs 18, can protrude into it. The location of the electrical components and power components and their fixation are equivalent to the procedure described for the other exemplary embodiment.

Figure 3:
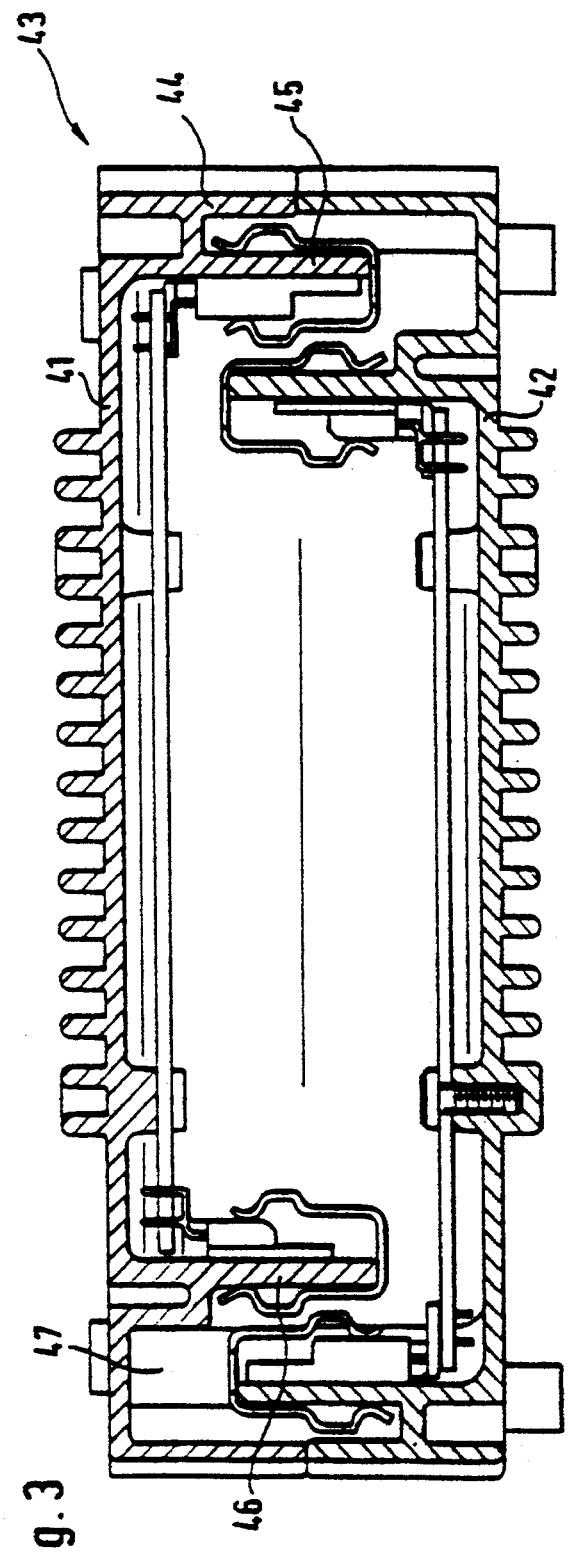
FIGS. 3 and 4 show modifications of FIG. 1.

In the exemplary embodiments described thus far and shown in FIGS. 1–3, the upper shells and lower shells are formed in one piece. In the final assembly, each shell is provided with a PC board that has already been equipped with electrical components and power components and has been soldered in final form. To that end, the PC board 15 or 25 is set on the knobs 14 and screwed down. After that, the soldered-on power components are secured to the rim 21 or side wall 16 with the aid of the retaining springs 18.

Figure 4:
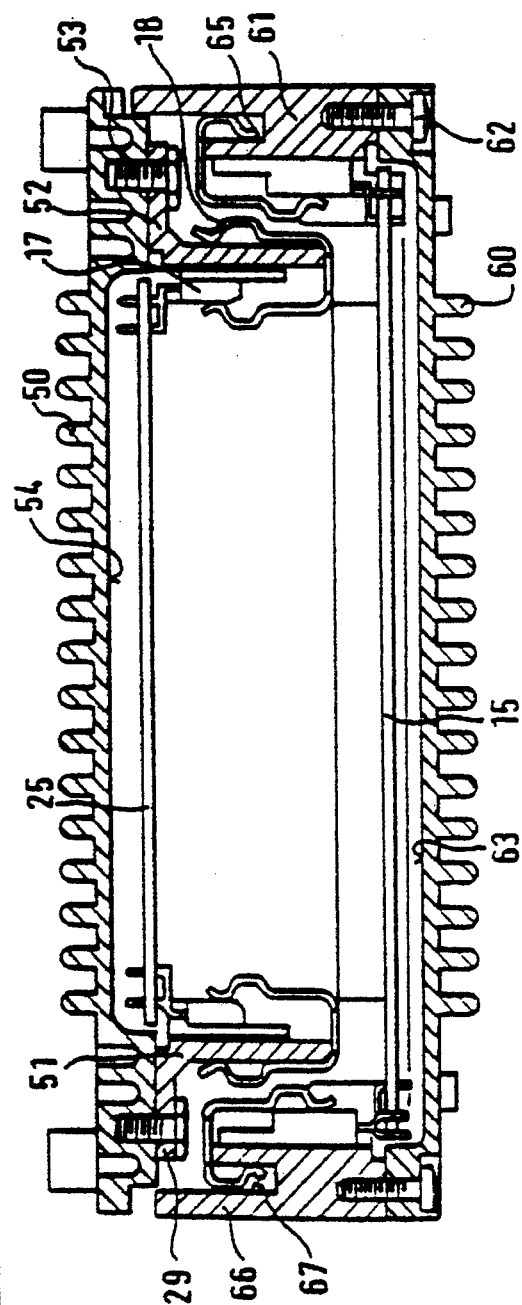

In the exemplary embodiment of FIG. 4 no bending of the leads, that is of the soldered-on electrical contacts, of the power components occurs. As a result, strains and cracks in the plastic housing of the power components are averted. Otherwise, an electrical failure of the power component or components would be possible because of a possible loss of seal and hence the invasion of moisture. To that end, in FIG. 4, the upper and lower shell each comprise a plurality of parts. The upper shell has a bottom 50, on which an encompassing frame 51 rests with a flangelike extension 52. In the region of the extension 52, the frame and the bottom are joined by a plurality of screws 53. The bottom 50 has a recess 54 on its inside that is at least deep enough that the PC board 25 is approximately flush with the face of the extension 52 resting on the bottom 50, and the side walls of the PC board 25 extend approximately flush with the inner wall of the frame 51. Secured to the frame 51, again with the aid of a retaining spring 18, are the power components 17 that are mounted on the PC board 25.

The lower shell likewise comprises a bottom 60 and an encompassing frame 61, which are joined together with the aid of screws 62 in such a way that the outer wall of the frame 61 is flush with that of the bottom 60. Once again, the bottom 60 has a recess 63, which is formed like the bottom 50 of the upper shell. As in the foregoing exemplary embodiments as well, the power components 17 located on the PC board 15 rest on the inner wall of the frame 61. The power components 17 are also secured to the frame 61 by the retaining spring 18, and the retaining spring 18 locks into place in an annular groove 65 formed in the face end toward the upper shell. The outer wall 66 of the annular groove 65 is longer than the inner wall 67. As a result, as in the other exemplary embodiments, it is possible to internest the upper shell and lower shell in one another, with the longer outer wall 66 of the frame 61 of the lower shell extending as far as the bottom 50 of the upper shell. Because of the multiple-part formation of the upper and lower shells, the power components 17, which are located on the PC board, can now be secured to the frame 52 or 61 with the aid of the retaining springs 18 and only afterward pass through the solder bath. As a result, no bending whatever of the leads of the power components 17 after soldering occurs, thus averting the sources of defects mentioned above. In the final assembly, only the applicable bottom 50 or 60 and the preassembled frame 51 or 61 are then screwed together with the applicable PC board 15 or 25, and then the two shells are set one inside the other.

Naturally the form of the upper and lower housing portions, or shells can be transposed, in all the exemplary embodiments.

Various changes and modifications may be made, and features described in connection with any one of the embodiments may be used with any of the others, within the scope of the inventive concept.

What is claimed is:

1. An electrical control device and housing combination, comprising a housing (10) having two housing portions (11, 12; 41, 42; 50, 51; 60, 61) which, upon assembly together, define the housing (10), wherein each of the housing portions (11, 12; 41, 42) includes a top or end wall (13, 24, 50, 60), and each of the housing portions has wall extensions (16, 22, 52, 66) projecting at an essentially right angle with respect to the respective top or end wall, said wall extensions being positioned with respect to the respective top or end wall such that, when the housing portions are assembled together with the wall extensions facing each other, the wall extensions from at least one housing portion will telescopically nest, with clearance space, within the other housing portion;

two printed circuit (PC) boards (15, 25), one each mounted in a respective one of said housing portions (11, 12; 41, 42; 50, 51; 60, 61);

a plurality of power components (17) defining two groups, each group of the power components being electrically and mechanically connected to a respective PC board;

wherein at least some of the power components of both groups are engaged in heat transfer coupling relation with at least one of the wall extensions (16, 22) of the housing portion to which the PC board is secured and with which the respective components are connected.

2. The combination of claim 1, wherein at least a first one (12) of the housing portions is formed with at least one of said extensions (22) and with a side wall or rim (21) parallel to and spaced from said at least one extension, and defining a recess (23) between the side wall and the said at least one wall extension (22); and the wall extension (16) of a second housing portion (11) protrudes into the recess (23) of the at least first one housing portion (12).

3. The combination of claim 2, wherein at least some of the power components (17) of the respective PC board in the respective housing portion (11,12) are located in the recess (23) of the respective housing portion and are attached to one of the extensions.

4. The combination of claim 1, wherein the housing portions have at least one side wall (21, 44), and at least one recess (47) defined by a space between the respective extension (45, 46) protruding into the housing (43) and an adjacent side wall (44), which side wall and extension form boundaries of the recess (47);

wherein at least one of one of the groups of the power components is located on the respective extension (45, 46) of one housing portion, and within the respective recess (47);

at least one of the extensions (46) of the other housing portion (42) is located inwardly from at least one of the respective extensions (45) from said one housing portion; and wherein the power components (17) are located on the inner walls of the extensions (45, 46) projecting from the respective housing portions.

5. The combination of claim 2, wherein, in both housing portions, one extension (45) is located close to the respective adjacent side wall (44) and one other extension (46) is spaced from the respective adjacent side wall with sufficient clearance to accommodate at least one of the power components (17); and the two housing portions (41, 42) are placed one on another in mirror-inverted fashion, so that, in the assembled state of the housing (43), the one extension (45) of one housing portion (41) protrudes into a space (47) formed between the side wall and the one other extension (46) of the other housing portion (42).

6. The combination of claim 1, wherein at least one of the housing portions comprises at least two parts (50, 51; 60, 61), one (50, 60) of said parts forming a top or end wall part (54, 63) and the other (51, 61) of said parts forming, at least in part, a wall extension part; and means (53) for securing said two parts of the housing portions together.

7. The combination of claim 6, wherein the PC boards (15, 25) are located, with clearance, adjacent the top or end wall part (54, 63); and the wall extension part comprises a frame secured by said securing means (53) to the respective top or end wall part, said frame carrying the extensions of the respective housing portions.

8. The combination of claim 7, wherein the frame part of one of the housing portions is formed with a groove (65) on a face end thereof remote from the top wall part, to which the respective frame part is secured.

9. The combination of claim 6, wherein said securing means (53) comprises screws.

10. The combination of claim 7, wherein the frame (52) of one housing portion protrudes into the interior of the other housing portion; and the frame (61) of the other housing portion is formed with an outer extension (66), which extends as far as the top or end wall part (50) of said one housing portion.

11. The combination of claim 1, wherein the top or end wall of one (11) of said housing portions (11, 12; 41, 42; 50, 51; 60, 61) is formed with protrusions on the outer surface, and wherein the other housing portion (12) is formed with an outer wall element (21) seated on said protrusion.

12. The combination of claim 1, wherein the power components (17) are located adjacent a rim of the respective PC board (15, 25) to which they are connected.

13. An electrical control device and housing combination comprising a housing having two housing portions (50, 51, 60, 61) which, upon assembly together, define the housing and are located essentially parallel to, spaced from, and facing each other, wherein each of the housing portions includes a top or end wall (63, 64) and a frame part (51, 61) secured to the respective top wall, said frame part having extension portions projecting at an essentially right angle with respect to the top or end wall;

attachment means (23) for securing one each of the frame parts to the respective top or end wall;

two printed circuit (PC) boards (15, 25), one each mounted parallel to a respective top or end wall (54, 63);

a plurality of power components (17), defining two groups, each group of power components being electrically and mechanically connected to a respective PC board;

said extension portions of the frame parts, when the frame parts are secured to the respective top or end wall, projecting towards each other so that, when the housing portions (50, 51, 60, 61) are assembled together with the extension portions facing each other, the extension portions from at least one housing portion will fit, with clearance, adjacent to and clear the extension portions of the housing portion facing said at least one housing portion with a predetermined clearance space;

wherein at least some of the power components of both groups are engaged in heat transfer coupling relation with that one of the extension portions of that housing portion in which one of the PC boards is located and with which the respective components are connected, and wherein said predetermined space is sufficient to accommodate at least those of the power components which are secured to that one of the extension portions with which the respective housing portion interfits.

14. The combination of claim 13, wherein said attachment means (53) comprises screws.

15. The combination of claim 13, wherein the frame part of one of the housing portions is formed with a groove (65) on a face end thereof, remote from the top or end wall, to which the respective frame part is secured.

16. The combination of claim 13, wherein the frame part (52) of one housing portion protrudes into the interior of the other housing portion; and one of the extension portions of the frame part (61) of the other housing portion is located at an end of the housing and forms an outer extension (66), which extends as far as the top or end wall part (50) of said one housing portion.

17. The combination of claim 13, wherein the top wall of one (11) of said housing portions (11, 12; 41, 42; 50, 60) is formed with protrusions on the outer surface thereof, and wherein the other housing portion (12) is formed with an outer wall element (21) seated on said protrusion.

18. The combination of claim 13, wherein the power components (17) are located adjacent a rim of the respective PC board (15, 25) to which they are connected.

19. The combination of claim 13, wherein at least one of the housing portions is formed with a side wall parallel to and spaced from the respective extension portion, and defining a recess (23) between the side wall and the respective extension portion; and the extension portion (16) of the housing portion (11) facing said at least one of the housing portions protrudes into the recess (23) of the other housing portion (12).

20. The combination of claim 19, wherein, in both housing portions, one extension portion is located close to the respective adjacent side wall and or other extension portion is spaced therefrom with sufficient clearance to accommodate at least one of the power components (17); and the two housing portions (41, 42) are placed one on another in mirror-inverted fashion, so that, in the assembled state of the housing (43), the extension portion of one housing portion (41) protrudes into a space formed between the side wall and a neighboring extension (46) of the other housing portion.

* * * * *